United States Patent [19]
Lee et al.

[11] Patent Number: 5,848,009
[45] Date of Patent: Dec. 8, 1998

[54] INTEGRATED CIRCUIT MEMORY DEVICES THAT MAP NONDEFECTIVE MEMORY CELL BLOCKS INTO CONTINUOUS ADDRESSES

[75] Inventors: Sung-soo Lee, Seoul; Young-ho Lim, Kyunggi-do, both of Rep. of Korea

[73] Assignee: Samsung Electronics Co., Ltd., Suwon, Rep. of Korea

[21] Appl. No.: 946,471

[22] Filed: Oct. 7, 1997

[30]  Foreign Application Priority Data

Oct. 8, 1996 [KR]  Rep. of Korea ................ 1996-44616

[51] Int. Cl.$^6$ .................................. G11C 7/00; G11C 8/00
[52] U.S. Cl. ................. 365/200; 365/230.03; 365/230.06
[58] Field of Search ................................ 365/200, 225.7, 365/230.03, 230.06, 189.08

[56]  References Cited

U.S. PATENT DOCUMENTS

| | | | |
|---|---|---|---|
| 4,310,901 | 1/1982 | Harding et al. | 365/200 |
| 4,355,376 | 10/1982 | Gould | 365/200 |
| 5,515,335 | 5/1996 | Fujita et al. | 365/200 |

*Primary Examiner*—Davin Nelms
*Assistant Examiner*—Trong Pham
*Attorney, Agent, or Firm*—Myers Bigel Sibley & Sajovec

[57]  ABSTRACT

Integrated circuit memory devices and operating methods map a plurality of memory cell blocks excluding defective memory cell blocks into a continuous address sequence of variable length. The memory cell blocks excluding the defective memory cell blocks, are preferably mapped to defective normal memory cell blocks, beginning at a highest memory cell block address and sequentially proceeding to lower cell block addresses, so as to generate continuous addresses for the memory cell blocks. Continuous address spaces may be provided by providing a plurality of flag blocks, a respective one of which corresponds to a respective one of the normal memory cell blocks. Each flag block contains a first indication that the corresponding normal memory cell block is nondefective, a second indication that the corresponding normal memory cell block is substituted with a redundant memory cell block, or a third indication that the corresponding normal memory cell block is substituted with another normal memory cell block. Then, upon addressing a normal memory cell block, a redundant memory cell block is substituted if the second indication is in the flag block that is associated with the selected normal memory cell block. A nondefective normal memory cell block is substituted for a selected normal cell block in response to the third indication being in the flag block that is associated with the selected normal memory cell block.

17 Claims, 8 Drawing Sheets

INTEGRATED CIRCUIT MEMORY DEVICES THAT MAP NONDEFECTIVE MEMORY CELL BLOCKS INTO CONTINUOUS ADDRESSES

FIELD OF THE INVENTION

This invention relates to integrated circuit memory devices and operating methods and more particularly to integrated circuit memory devices and operating methods that are operable notwithstanding the presence of defective memory cell blocks.

BACKGROUND OF THE INVENTION

Integrated circuit memory devices are continuing to increase in integration density, so that more and more memory cells may be formed on an integrated circuit chip. As the integration density of integrated circuit memory devices continues to increase, it may be more difficult to fabricate integrated circuit memory devices that are completely free of defective memory cells. Accordingly, it is known to provide integrated circuit memory devices that include provisions for repairing defective memory cells using redundancy.

Memory devices that employ redundancy generally include a spare or redundant memory cell array in addition to a normal memory cell array. A redundant memory cell array includes a plurality of redundant memory cells that are substituted for defective memory cells so as to render the integrated circuit memory device fully operable. In such redundancy techniques, if the number of defective cells is larger that the number of redundant memory cells, the defects can no longer be repaired and the integrated circuit memory device is generally unusable.

Integrated circuit memory devices that employ redundancy generally include a plurality of normal memory cell blocks, for example a plurality of rows and a plurality of columns of normal memory cells. The integrated circuit memory devices also include a plurality of redundant memory cell blocks, for example a plurality of rows and a plurality of columns of redundant memory cells. A control circuit stores address information that identifies defective cells, also referred to as defective addresses. The redundancy circuitry compares the present address to the defective addresses so as to determine whether a normal memory cell block should be addressed or a redundant memory cell block should be addressed.

In one specific example, a row redundancy circuit activates a redundant row instead of a defective row when the present row address that is applied to the memory corresponds to the address that has been programmed in the memory for the redundant row. Similarly, a column redundancy circuit may substitute a redundant column of memory cells for a defective column of memory cells. Upon addressing the defective column of memory cells, the spare column of memory cells is actually accessed. An example of redundancy technology is disclosed in Korean Patent Application No. 95-1737.

FIG. 1 is a block diagram of a conventional memory device having redundancy circuitry. As shown, the memory device includes main memory cell array 10, row redundant cell array 12, row predecoder 14, row address storage block 16, normal row decoders MRD0 to MRD511 and redundant row decoders RRD0 to RRD15. Main memory cell array 10 includes 512 row blocks MCBK0 to MCBK511 to which 512 row decoders MRD0 to MRD511 are correspondingly coupled. Redundant row blocks RCBK0 to RCBK15 are coupled to redundant row decoders RRD0 to RRD15 that are set to select redundant blocks corresponding to defective row blocks of the main memory cell array 10. It will be understood that main memory cell array 10 also may be coupled to a column redundant cell array, sense amplifiers, column decoders, data input/output buffers, data input/output selection circuits and read/write control circuits.

Row predecoder 14 generates pre-decoding signals for selecting row blocks of main memory cell array 10 in response to row address signals. Row address storage blocks 16 receive row addresses relevant to defective row blocks and then generate control signals which cause a normal row decoder MRDk (where k is one of 0 to 511) and a redundant row decoder RRDk be disabled and enabled, respectively, when the received address corresponds to one of the earlier programmed address that is to be repaired.

The normal row decoders activate block selection lines embedded in main memory cell array 10 in response to pre-decoding signals supplied from row predecoder circuit 14. Each block selection line activates one of the row blocks. At the same time, the redundant row decoders activate block selection lines embedded in redundant memory cell array 12 in response to redundant block selection signals provided from the row address storage blocks 16, so that a block selection pre-decoding signal activates a corresponding row block out of the redundant memory cell array. A normal row block of the main memory cell array 10, including one or more defective memory cells, may be substituted with a redundant row block of the redundant memory cell array 12 which has the same address with the defective row block of the main memory cell array 10. The row address storage block 16 generally employs a programmed circuit with nonvolatile elements, such as fuses or ROM transistors including but not limited to PROM, EPROM and EEPROM transistors.

Polysilicon fuses are often used for the defective address storage means in the blocks 16 of FIG. 1. These fuses can be activated or blown by a laser beam or current flow. Fuse programming by current flow may use additional pads and pins for receiving the large current to blow a fuse, thereby increasing the memory chip size. Advantageously, fuse blowing can be performed before or after packaging. In contrast, laser beam programming is generally performed before packaging the device.

It will be understood that the provision of redundant blocks of memory cells may itself increase the size and complexity of integrated circuit memory chips. Accordingly, it is generally not desirable to include more redundant memory cell blocks that is expected to be needed to repair an expected number of defective normal memory cell blocks. For example, in FIG. 1, 16 redundant row blocks are allocated for 512 main memory cell blocks. The number of redundant cell blocks is generally determined based on the size of the normal memory cell array, the fabrication yields, the ultimate yield that is desired and/or other factors.

For a given integrated circuit memory device, if the number of defective normal memory cell blocks exceeds the number of redundant memory cell blocks, then not all of the defective normal memory cell blocks can be repaired. In one scenario, such an integrated circuit memory device is deemed to be defective and is not used. In another scenario, these integrated circuit memory devices may be used as non-fully functional memory devices. For example, a telephone answering machine can use such defective memories in order to reduce the manufacturing costs thereof. In another example, if the integrated circuit memory device is an EEPROM device, the device may be used in a personal computer in a manner similar to a hard disk wherein a user identifies one or more unrecoverable defective blocks. Thus, similar to a hard disk, the EPROM device can be used notwithstanding the fact that it has bad blocks.

In FIG. 1, an identification of a bad block, hereinafter referred to as a "mapping," is carried for the row block MRDk of the main memory cell array 10 which is defective and which exceeds the number of redundant memory cell blocks that are provided. Once designated as a bad block, the row block MRDk should not be accessed by an internal processing algorithm of a controller. When multiple bad memory blocks that exceed the redundancy capacity are present, the mapping of the integrated circuit device can become complicated due to gaps in the addressing that result from the defective blocks that are not repaired. Accordingly, prior to use, the personal computer may carry out a mapping process that can identify the bad blocks in the integrated circuit memory device so that these bad blocks are not addressed. This mapping may be time consuming and inconvenient for a user.

SUMMARY OF THE INVENTION

It is therefore an object of the present invention to provide improved integrated circuit memory devices and operating methods that include redundancy.

It is another object of the present invention to provide integrated circuit memory devices and operating methods that allow integrated circuit memory devices having more defective normal memory cell blocks than there are redundant memory cell blocks to be operated, without creating undue user penalty.

These and other objects are provided according to the present invention, by integrated circuit memory devices and operating methods that map a plurality of memory cell blocks excluding defective memory cell blocks into a continuous address sequence of variable length. The memory cell blocks excluding the defective memory cell blocks are preferably mapped to defective normal memory cell blocks, beginning at a highest memory cell block address and sequentially proceeding to lower cell block addresses, so as to generate continuous addresses for the memory cell blocks. Accordingly, when the number of defective normal memory cell blocks exceeds the number of redundant memory cell blocks, the integrated circuit memory devices can still be used and addressed as a continuous address space. The continuous address space will be of variable length, depending upon the number of defective normal memory cell blocks that exceed the number of redundant memory cell blocks.

Integrated circuit memory devices according to the invention include the plurality of normal memory cell blocks and a plurality of redundant memory cell blocks. Nondefective normal memory cell blocks are substituted for defective normal memory cell blocks that remain after substitution of the plurality of redundant memory cell blocks for defective normal memory cell blocks, so as to generate continuous addresses for the nondefective normal memory cell blocks. Nondefective normal memory cell blocks are sequentially substituted, beginning at a highest nondefective normal memory cell block address and sequentially proceeding to lower nondefective normal memory cell block addresses. The substitution is made for normal memory cell blocks that remain after substitution of the plurality of redundant memory cell blocks for defective normal memory cell blocks, so as to generate continuous addresses for the nondefective normal memory cell blocks.

Continuous address spaces may be provided, according to the present invention, by providing a plurality of flag blocks, a respective one of which corresponds to a respective one of the normal memory cell blocks. Each flag block contains a first indication that the corresponding normal memory cell block is nondefective, a second indication that the corresponding normal memory cell block is substituted with a redundant memory cell block, or a third indication that the corresponding normal memory cell block is substituted with another normal memory cell block. Then, upon addressing a normal memory cell block, a redundant memory cell block is substituted if the second indication is in the flag block that is associated with the selected normal memory cell block. A nondefective normal memory cell block is substituted for a selected normal memory cell block in response to the third indication being in the flag block that is associated with the selected normal memory cell block.

The second indication may comprise a plurality of second indications and the third indication may comprise a plurality of third indications. In this case, a selected redundant memory cell block is substituted for a selected normal memory cell block in response to a selected one of the second indications being in the flag block that is associated with the selected normal memory cell block. A selected nondefective normal memory cell block is substituted for a selected normal memory cell block in response to a selected one of the third indications being in a flag block that is associated with the selected normal memory cell block.

Each of the flag blocks may comprise a plurality of flag cell strings. Each flag cell string comprises a plurality of flag cell transistors that are serially connected between a pair of flag cell string selection transistors. The flag cell strings store the first indication, the second indication or the third indication. A plurality of flag word lines is also included in each flag cell block, a respective one of which is connected to a corresponding flag cell transistor in each of the flag cell strings. A plurality of flag bit lines is also included in each of the flag cell blocks. A respective one of the flag bit lines is connected to at least one of the flag cell string selection transistors.

More flag cell strings may be provided in each of the flag cell block than is necessary to provide a unique identification of a redundant memory cell block or a substitute normal memory cell block. In this case, the same indication can be stored in multiple flag cell strings to provide reliable, high speed mapping.

BRIEF DESCRIPTION OF THE DRAWINGS

Other features and advantages of the invention will become apparent in the following detailed description of the preferred embodiment, with reference to the accompanying drawings, of which.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The invention will be described with reference to a flash EEPROM having a NAND-type cell arrangement. However, the invention may also be applied to other integrated circuit memory devices.

Figure 2:
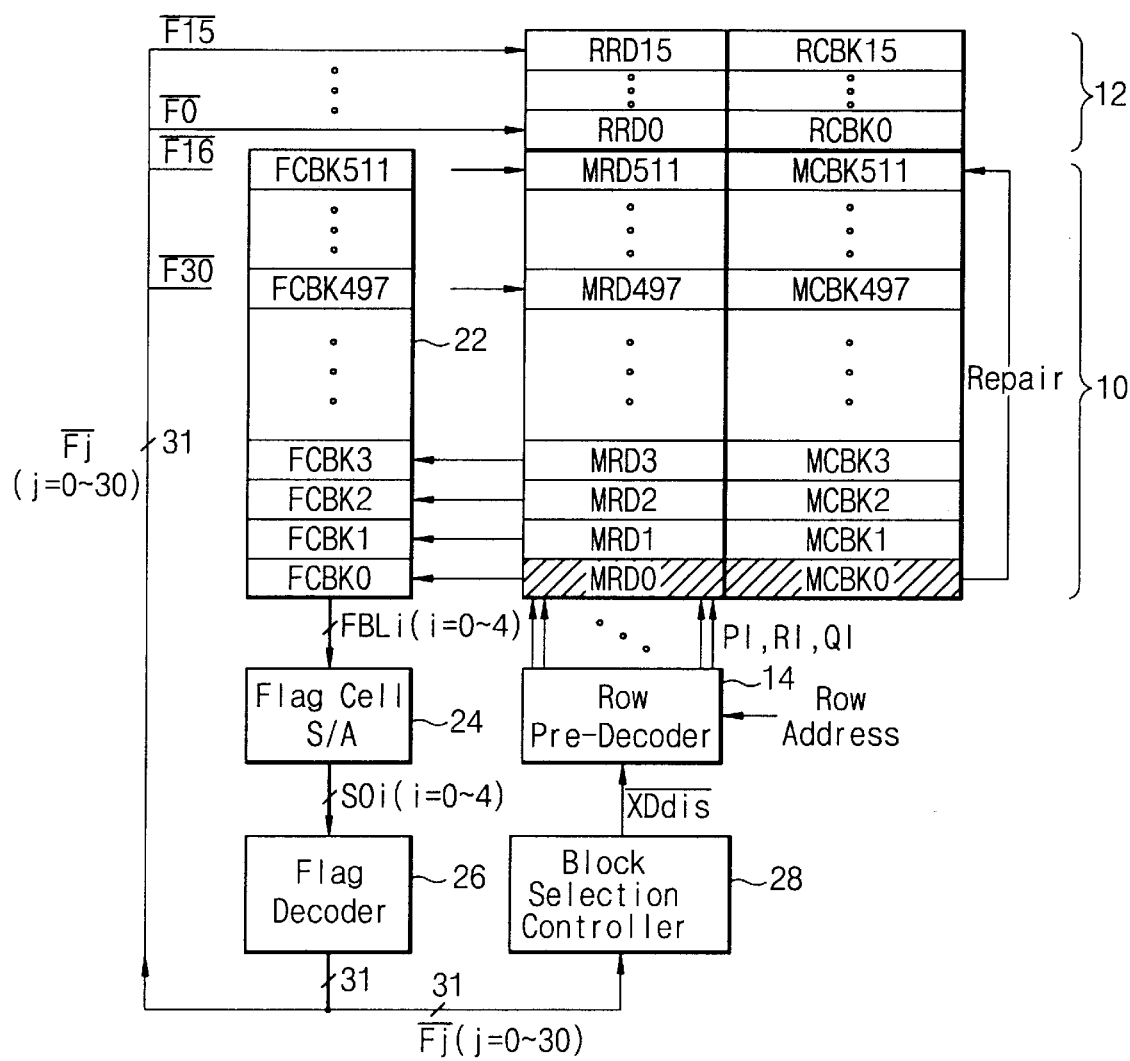
FIG. 2 is a block diagram illustrating architectures of integrated circuit memory devices according to the present invention.

Referring now to FIG. 2, main memory cell array 10 includes 512 normal row blocks MCBK0 to MCBK511 and redundant memory cell array 12 includes 16 redundant row blocks RCBK0 to RCBK15. Each of the normal and redundant row blocks is correspondingly coupled to each of normal and redundant row decoders RRD0 to RRD15 and MRD0 to MRD511. The integrated circuit memory device also includes mapping circuitry which includes row predecoder 14, normal row decoders MRD0 to MRD511, redundant row decoders RRD0 to RRD511, flag cell array 22 including flag cell blocks FCBK0 to FCBK511, flag sense amplifier 24, flag decoder 26 and block selection controller 28. These elements may be used to substitute defective row blocks of the main memory cell array with nondefective row blocks and also to generate a mapped arrangement of all bad blocks.

Row predecoder 14 generates predecoding signals Pl, Ql and Rl (where l ranges from 0 to 7) to select normal row blocks of the main memory cell array in response to row address signals. Flag cell blocks FCBK0 to FCBK511 of the flag cell array are arranged with the same number of the normal row blocks MCBK0 to MCBK511 and store information about their corresponding normal row blocks. The stored information provides unique identification for each block in order direct a mapping configuration according to the invention. Flag sense amplifier 24 is connected to flag cell array 22 through flag bit lines FBLi (where i ranges from 0 to 4) and reads out the information relevant to the normal row blocks therefrom, generating defective block status signals SOi (where i ranges from 0 to 4). Flag decoder 26 receives the defective block status signals SOi from flag sense amplifier 24 and then generates repair block selection signals FjB (where j ranges from 0 to 30). The suffix "B" will be used to indicate a complementary signal to its corresponding numeral. For example, F15B is a complementary signal to F15. Block selection controller 28 receives the repair block selection signals FjB from the flag decoder 26 so as to cause normal row decoders associated with defective row blocks to be inactivated.

When the number of defective row blocks of main memory cell array 10 exceeds the number of redundant row blocks RCBK0 to RCBK15, such that there are extra defective row blocks, the extra defective row blocks are replaced with nondefective row blocks arranged on main memory cell array in an order from MCBK511 (i.e., the most significant row block) to MCBK0 (i.e., the least significant row block). Assuming that the number of the defective row blocks is 18, then two defective blocks may be replaced with blocks MCBK511 and MCBK510 of main memory cell array 10 while 16 defective row blocks were previously interchanged with all of redundant row blocks RCBK0 to RCBK15. Thus, continuous row blocks MCBK509 to MCBK0 can be used as nondefective row blocks of variable length. It should be understood that the row blocks MCBK509 to MCBK0 that are regarded as nondefective blocks (or usable blocks) by a user, contain one or more defective blocks. Accordingly, the user need not carry out a bad block mapping sequence and can appreciate which row blocks are in the usable condition according to the information for the number of extra defective row blocks.

Figure 3:
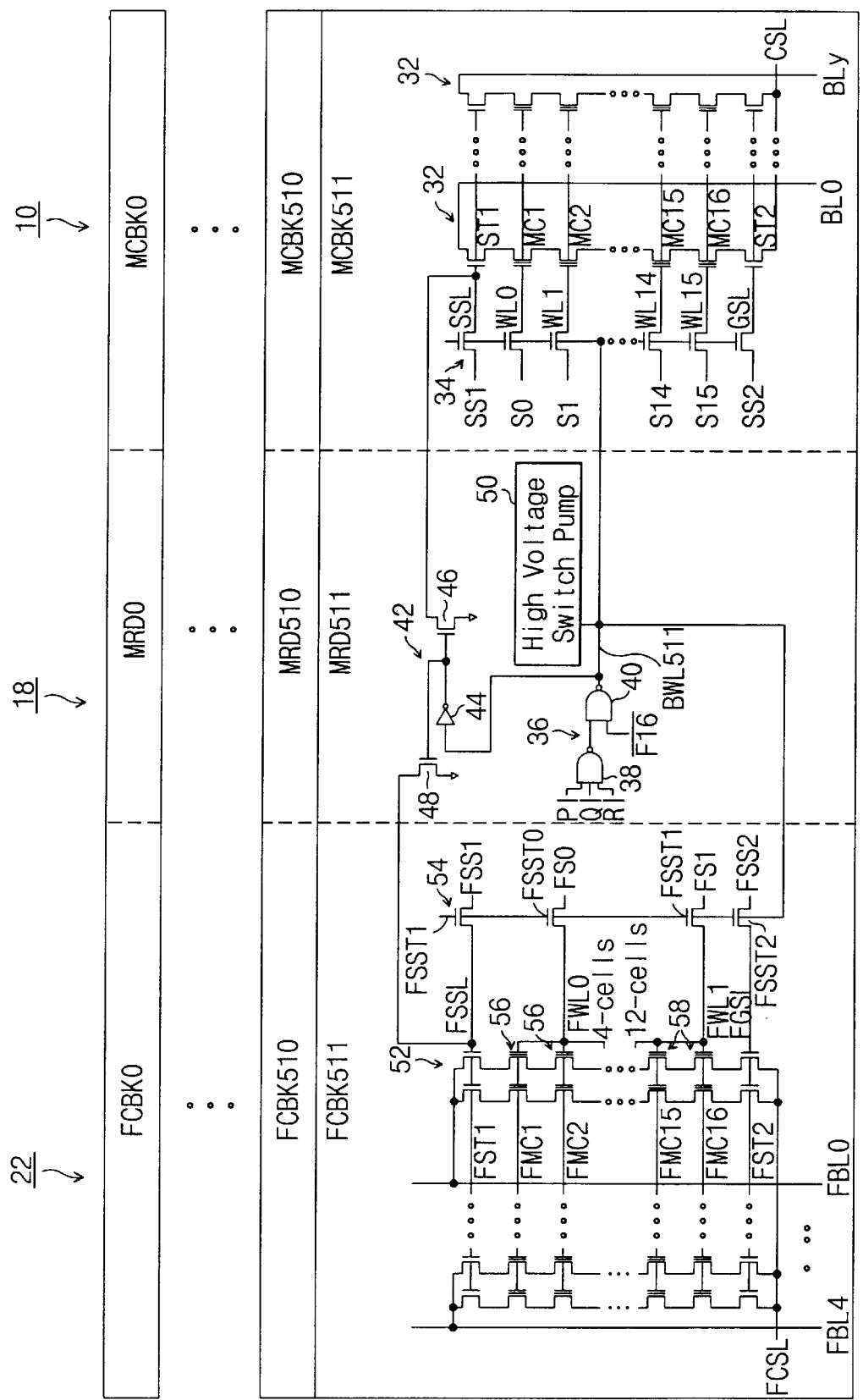
FIG. 3 is a circuit diagram illustrating a memory cell array, row decoders and flag cell arrays of FIG. 2.

FIG. 3 illustrates main memory cell array 10, normal row decoders MRD0 to MRD511 and flag cell array 22, and shows an operative connection between normal row block MCBK511 of main memory cell array 10, normal row decoder MRD511 and flag cell block FCBK511 of flag cell array 22 to couple an address. Other connections with the normal row block, normal row decoder and flag cell block are as illustrated in FIG. 2.

Referring to FIG. 3, word lines WL0 to WL15 coupled to word line source signals S0 to S15, are connected to gates of cell transistors MC1 to MC16 which are connected from string selection transistor ST1 to ST2 in cell string 32 of a NAND-type logic. Cell strings such as the string 32 are repeatedly arranged in block MCBK511. Each string selection transistor of the cell strings is coupled to its corresponding bit line. For example, ST1 is coupled to bit line BL0. Sources of all transistors ST2 are connected to common source line CSL. The word lines WL0 to WL16 are coupled to word line source signals S0 to S15 through gate transistors of word line gate circuit 34. Two gate transistors of the gate circuit 34 connect string selection line SSL and GSL respectively coupled to gates of ST1 and ST2, to string selection signals SS1 and SS2, respectively. All gate electrodes of the transistors of gate circuit 34 are coupled to block word line BWL511, supplied from decoder MRD511, which is activated when the present block MCBK511 is selected therein.

Normal row decoder MRD511 receives block selection signals Pl, Ql and Rl (where l ranges from 0 to 7) from row predecoder 14 of FIG. 2, at input terminals of NAND gate 38. The output of NAND gate 38 and redundant block signal F16B generated from flag decoder 26 of FIG. 2 are applied to input terminals of NAND gate 40. The output node of NAND gate 40 is coupled to block word line BWL511 and an output of high voltage switch pump 50. The output from NAND gate 40 is coupled to the gate of NMOS transistor 46 which is connected between a node on SSL and ground, through inverter 44. The gate of transistor 46 is coupled to the gate of NMOS transistor 48 which is connected between a node on flag string selection line FSSL and ground. The transistors 46 and 48 pull down string selection line SSL and flag string selection line FSSL to ground when blocks MCBK511 and FCBK511 are not selected.

Flag cell array 22 includes flag cell strings 52 of the same structure as cell strings 32 of the normal row blocks such as MSBK511. Each flag cell string includes flag selection transistors FST1 and FST2 and flag cell transistors FMC1 to FMC16.

It should be noted that the arrangement and interconnection configurations of flag word lines FWL0 and FWL1 and flag bit lines FBL0 to FBL4 are quite different from those in the normal row block MCBK511. Flag word line FWL0, the first word line of the flag cell block, is formed by wiring together four word lines each coupled to control gates of the corresponding flag cell transistors that are arranged along the row direction. Another flag word line FWL1, the second word line of the block FCBK0, is formed by wiring the remaining twelve word lines each coupled to control gates of the corresponding flag cell transistors which are also arranged along the row direction. In particular, the control gates of the first through fourth flag cell transistors FMC1 to FMC4 in flag cell strings 52 are all connected to the flag word line FWL0 which is coupled to flag word line source signal FS0 through flag gate transistor FSGT0. Moreover, the control gates of the fifth through sixteenth transistors FMC5 to FMC16 are all connected to the flag word line FWL1 which is coupled to flag word line source signal FS1 through flag gate transistor FSGT1. Flag word line FWL0 acts as a selected word line while FWL1 acts as a non-selected word line in flag cell block FCBK511. Such an interconnection scheme with the flag word lines can provide sensing stability for off-cells which are programmed because, even when three cell transistors among four selected cell transistors in one flag cell string are defective in a worst case, the remaining flag cell transistor can provide information for the off-cell.

Flag string selection line FSSL is coupled to the gates of flag string selection transistors FST1 and receives flag string selection signal FSS1 through flag gate transistor FSST1. The gates of the other flag string selection transistors FST2 are coupled to flag string selection line FGSL which receives flag string selection signal FSS2 through flag gate transistor FSST2. All sources of FST2 are connected to flag common source line FCSL. All of the gates of the flag gate transistors FSST1, FSGT0, FSGT1 and FSST2 are coupled to block word line BWL511 from normal row decoder MRD511.

Each of flag bit lines FBL0 to FBL4 is coupled to three flag cell strings in parallel. Those parallel connections between flag bit lines and flag cell strings may be advantageous for enhancing sensing speed of an addressed cell while detecting defective blocks, because current by addressed cells flows through plural paths (e.g., three current paths) to ground. Furthermore, even when two flag cell strings of the three strings corresponding to one bit line are defective in a worst case, it may be possible to succeed in sensing using the remaining one string.

The programming and erase operations in the flag cell array 22 will now be described, with reference to TABLE 1 as follows. TABLE 1 demonstrates the case of programming and erasing a selected flag cell block such as FCBK511.

TABLE 1

| signal | programming | erasing |
|---|---|---|
| BWL | Vpgm + V | Vcc |
| FSSL | Vcc | FLOATING |
| FS0 | Vpgm (18 V) | 0 V |
| FS1 | Vpgm (18 V) | 0 V |
| FGSL | 0 V | FLOATING |
| FCSL | 0 V | FLOATING |
| FBL (selected) | 0 V | FLOATING |
| FBL (unselected) | 0 V | FLOATING |

Prior to programming, the selected flag cell block is erased. As shown on TABLE 1, block word line BWLm (where m is one of 0 to 511) is pulled up to Vcc (power supply voltage), and flag word line source signals FS0 and FS1 retain 0 V while flag string selection lines FSSL and FGSL, and flag common source line FCSL and all flag bit lines are floating, i.e., there is no bias condition applied thereto. All of the flag cell transistors have negative threshold voltages.

In order to set the program condition for the flag cell block, as shown on TABLE 1, the voltage level of flag word line source signals FS0 and FS1 goes to Vpgm (about 18 V) that is applied to flag word lines FWL0 and FWL1 each through gate transistors FSGT0 and FSGT1 whose gates are coupled to block word line BWLm of Vpgm+V. The voltage level which can produce the program voltage Vpgm is passed through the gate transistor without voltage drop by a threshold voltage. During this operation, flag string selection line FSSL is held at Vcc, and FGSL and FCSL are pulled down to 0 V.

Meanwhile, 0 V is applied to the selected flag bit line while Vcc is applied to unselected bit lines. The corresponding normal block such as MCBK511 vs. FCBK511 is not activated during the program operation with the flag cell block, because string selection signals SS1 and SS2, word line source signals S0 to S15 are held at 0 V, even though the block word line BWLm i.e., BWL511 becomes the Vpgm+V. A more detailed description of redundant programming with the flag cell blocks will be provided thereinafter.

Figure 1:
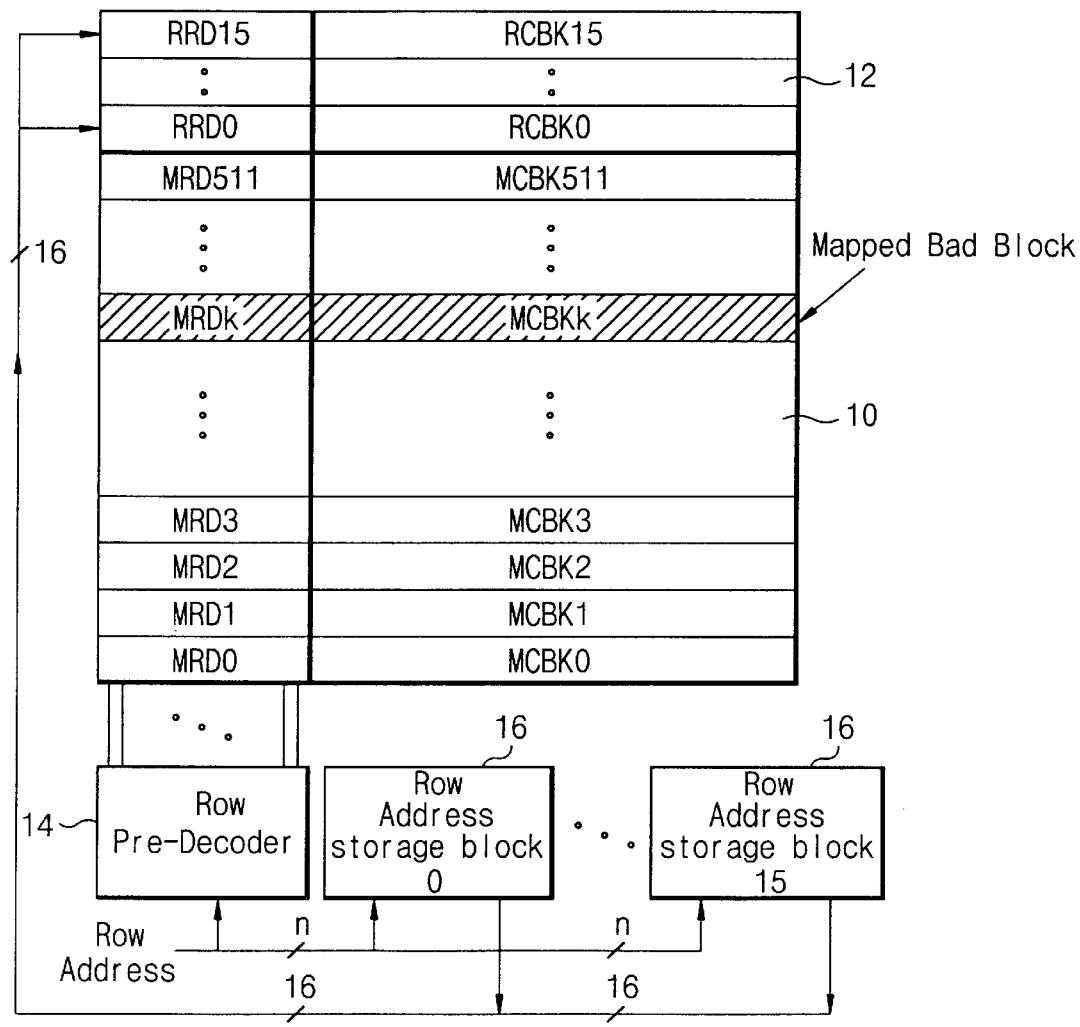
FIG. 1 illustrates an architecture of a conventional integrated circuit memory.
Figure 4:
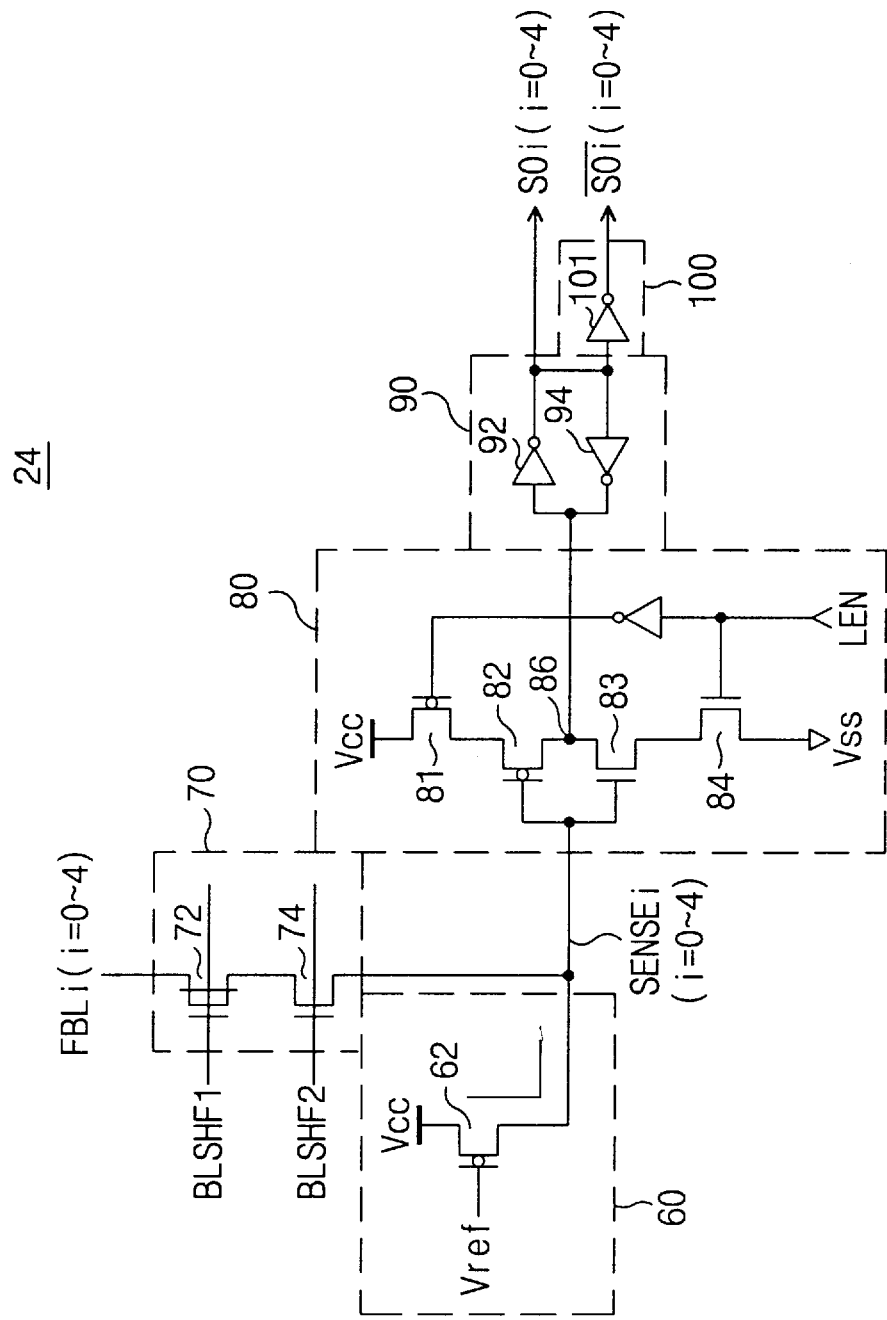
FIG. 4 is a circuit diagram of a flag sense amplifier of FIG. 2.

FIGS. 4 through 7 illustrate circuit configurations of block components including flag sense amplifier 24, flag decoder 26, block selection controller 28 and row predecoder 14. Referring to FIG. 4, the sense amplifier 24 is formed of current supply 60, isolation circuit 70, tristate inverter 80, latch 90 and inverter 101. Current supply 60 includes PMOS transistor 62 including a gate coupled to reference voltage Vref and a drain coupled to Vcc. Isolation circuit 70, depletion transistor 72 and NMOS transistor 74 are connected between flag bit line FBLi (where i ranges from 0 to 4) so that five sense amplifiers such as FIG. 4 are substantially provided to the structure of FIG. 1 and sensing node SENSEi (where i ranges from 0 to 4) coupled to source of transistor 62. These gates are coupled to flag bit line shielding signals BLSHF1 and BLSHF2, respectively. Tristate inverter 80 is formed of a pair of PMOS and NMOS transistors 82 and 83 having gates coupled to sensing node SENSEi, and a pair of PMOS and NMOS transistors 81 and 84 whose gates respond to enable signal LEN. The input of latch 90 is coupled to the output node 86 of tristate inverter 80. From the output of latch 90, defective block status signals SOi and SOiB (where i ranges from 0 to 4) are generated and applied to flag decoder 26. The bit number of the defective block status signals generated from five sense amplifiers such as shown in FIG. 4 corresponds to that of the flag bit lines FBL0 to FBL4 in FIG. 3.

Figure 5:
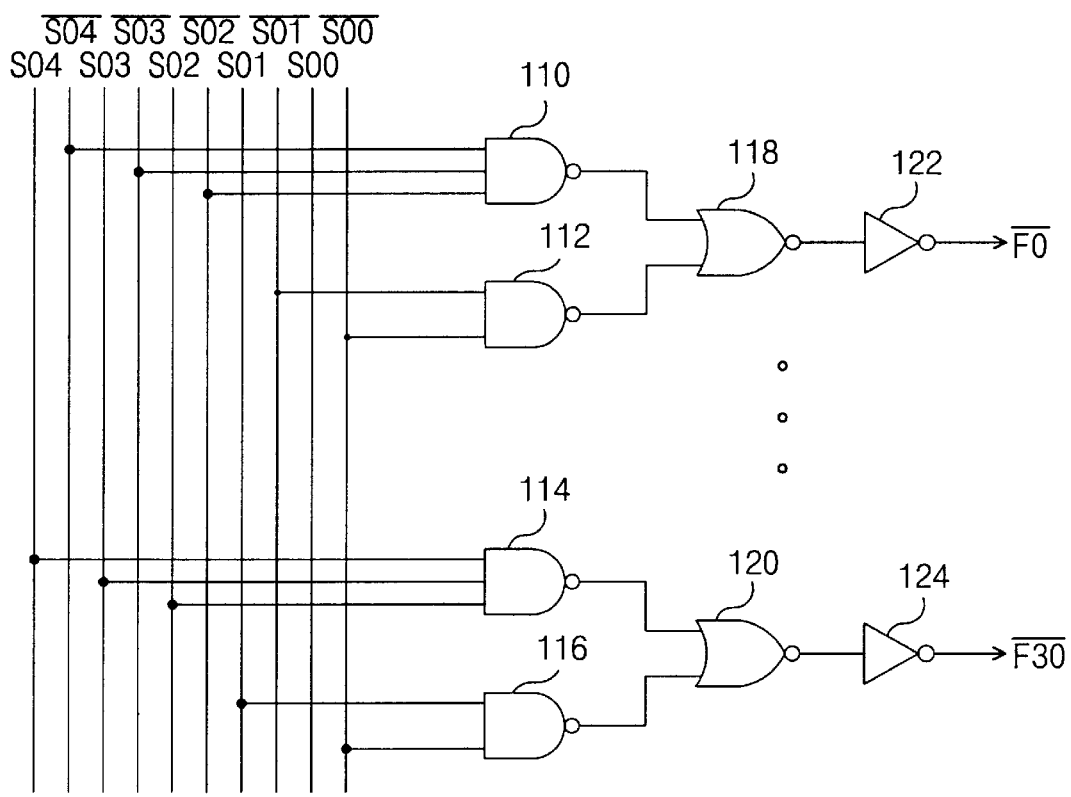
FIG. 5 is a circuit diagram of a flag decoder of FIG. 2.

Referring to FIG. 5, in order to create each repair block selection signal, defective block status signals SO0 to SO4 and their complementary signals SO0B to SO4B are applied to input terminals of NAND gates 110 to 116. The input arrangements of the defective block status signals for the NAND gates are set into a rule of binary combinations from SO4B-SO3B-SO2B-SO1B-SO0B to SO4-SO3-SO2-SO1-SO0B vs. F0B to F30B. The outputs of the NAND gates are generated as repair block selection signals F0B to F30B, through NOR gates 118 to 120 and inverters 122 to 124. It may be seen that the number of the repair block selection signals becomes 31 of F0B to F30B in the present embodiment because one of the code combinations, i.e., "11111", with the five bits of the defective block status signals, identifies a normal (nondefective) condition of its corresponding blocks.

The number 31 represents the number of programming patterns available in the flag cell block. The created specification of the repair block selection signals F0B to F30B, according to coded combinations with the defective block status signals SO0 to SO4, are illustrated in TABLE 2 where selected repair blocks (blocks which participate in substitution orders for redundancy, either redundant row blocks or normal row blocks) corresponding to the repair block selection signals are accompanied therewith. As an example, in TABLE 2, when the associated codes with the defective block status signals SO4 to SO0 are set into "01111", repair block selection signal F15B becomes enabled and then causes redundant row block RCBK15 to be selected. Similarly, the code "10000" of SO4 to SO0 is provided for F16B which activates normal row block MCBK511 as a repair block. It will be understood from TABLE 2 that the substitution sequence proceeds in the order from the first redundant row block RCBK0 towards the least significant normal row block MCBK0, such as RCBK0, RCBK1, . . . , MCBK511 (the most significant normal row block), MCBK510, . . . , in that order.

TABLE 2

| FjB | SO4 | SO3 | SO2 | SO1 | SO0 | repair block to be substituted |
|---|---|---|---|---|---|---|
| F0B | 0 | 0 | 0 | 0 | 0 | RCBK0 |
| F1B | 0 | 0 | 0 | 0 | 1 | RCBK1 |
| F2B | 0 | 0 | 0 | 1 | 0 | RCBK2 |
| . | . | . | . | . | . | . |
| F15B | 0 | 1 | 1 | 1 | 1 | RCBK15 |
| F16B | 1 | 0 | 0 | 0 | 0 | MCBK511 |
| F17B | 1 | 0 | 0 | 0 | 1 | MCBK510 |
| . | . | . | . | . | . | . |
| F28B | 1 | 1 | 1 | 0 | 0 | MCBK499 |
| F29B | 1 | 1 | 1 | 0 | 1 | MCBK498 |
| F30B | 1 | 1 | 1 | 1 | 0 | MCBK497 |
|  | 1 | 1 | 1 | 1 | 1 | nondefective block |

As already described, the number of the defective block status signals corresponds to that of the flag bit lines, such as SO0 to SO4 vs. FBL0 to FBL4. Thus, TABLE 3 illustrates the associative relations between sets of programmed data bits for the flag bit lines and substituted blocks for redundancy as the number of defective blocks increase. TABLE 3 also shows that coded configurations for the flag bit lines are the same as those of the defective block status signals.

TABLE 3

| number of defective blocks | SO4 | SO3 | SO2 | SO1 | SO0 | repair block to be substituted |
|---|---|---|---|---|---|---|
| 1 | 0 | 0 | 0 | 0 | 0 | RCBK0 |
| 2 | 0 | 0 | 0 | 0 | 1 | RCBK1 |
| 3 | 0 | 0 | 0 | 1 | 0 | RCBK2 |
| . | . | . | . | . | . | . |
| 16 | 0 | 1 | 1 | 1 | 1 | RCBK15 |
| 17 | 1 | 0 | 0 | 0 | 0 | MCBK511 |
| 18 | 1 | 0 | 0 | 0 | 1 | MCBK510 |
| . | . | . | . | . | . | . |
| 29 | 1 | 1 | 1 | 0 | 0 | MCBK499 |
| 30 | 1 | 1 | 1 | 0 | 1 | MCBK498 |
| 31 | 1 | 1 | 1 | 1 | 0 | MCBK497 |
|  | 1 | 1 | 1 | 1 | 1 | nondefective block |

Figure 6:
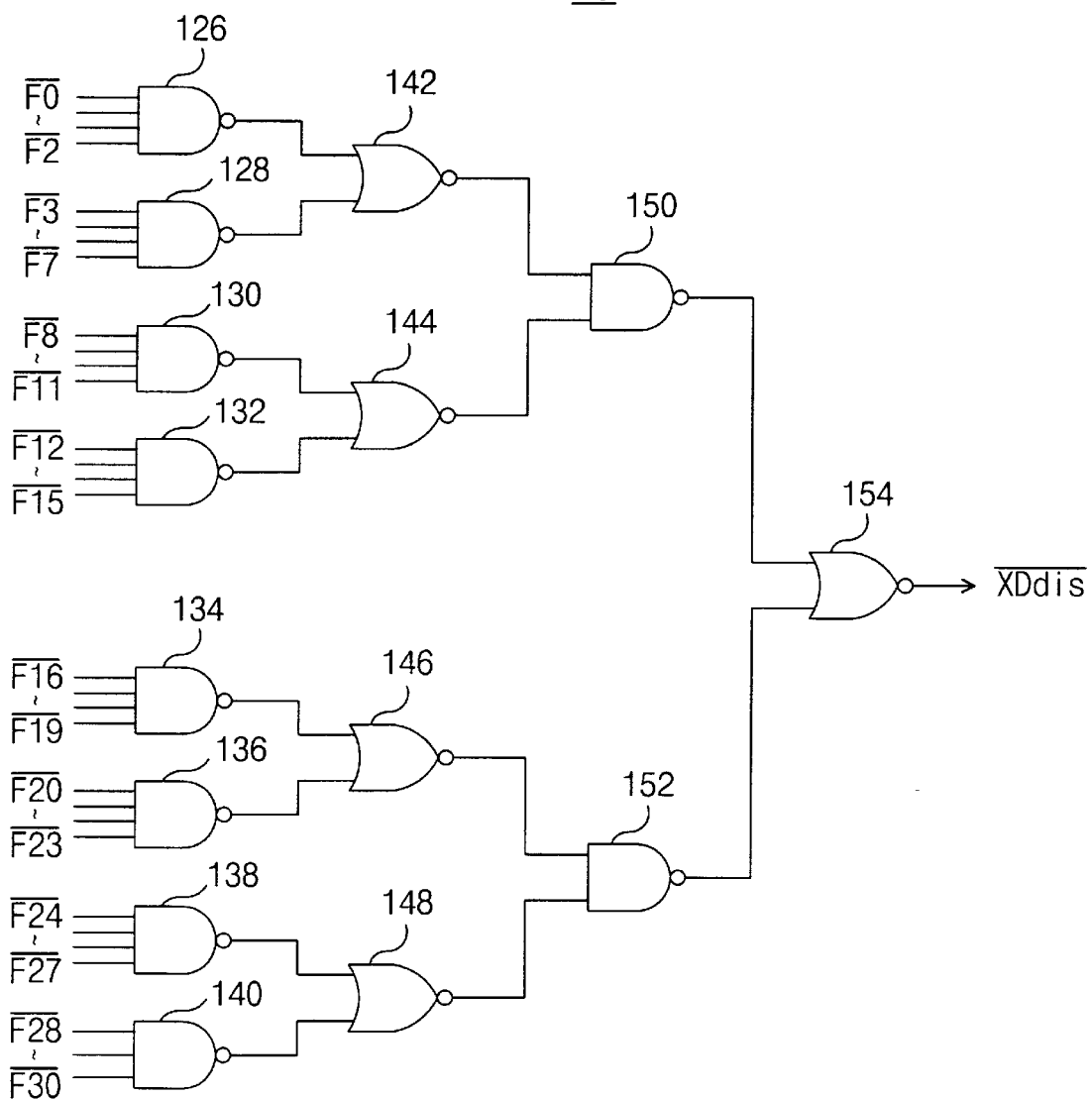
FIG. 6 is a circuit diagram of a block selection controller of FIG. 2.

Referring to FIG. 6, block selection controller 28 generates normal row decoder disable signal XDdisB through NOR gate 154 which receives outputs of NAND gates 150 and 152. Input terminals of NAND gate 150 are coupled to outputs of NOR gates 142 and 144, and input terminals of NAND gate 152 are coupled to outputs of NOR gates 146 and 148. Inputs of the NOR gates 142 to 148 are coupled to outputs of NAND gates 126 to 140, each NOR gate receiving output signals from two NAND gates. Repair block selection signals are applied to each of NAND gates 126 to 140 by four in order, such that F0B to F3B are applied to NAND gate 126 and so on. Row decoder disable signal XDdisB is applied to row predecoder 14.

Figure 7:
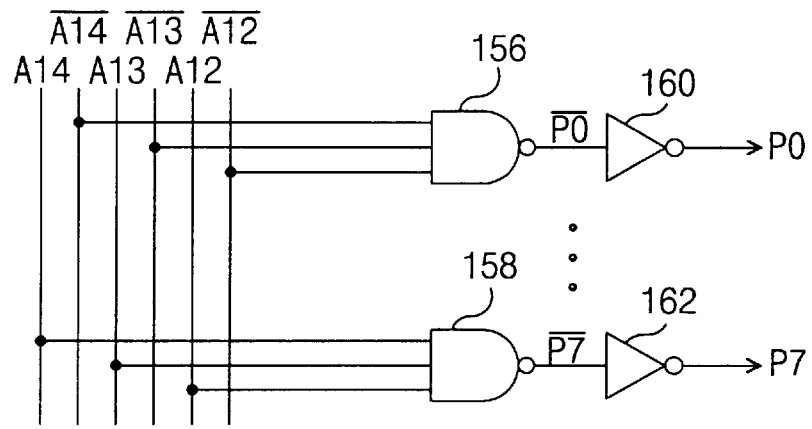
FIG. 7 is a circuit diagram of a row predecoder of FIG. 2.
Figure 7:
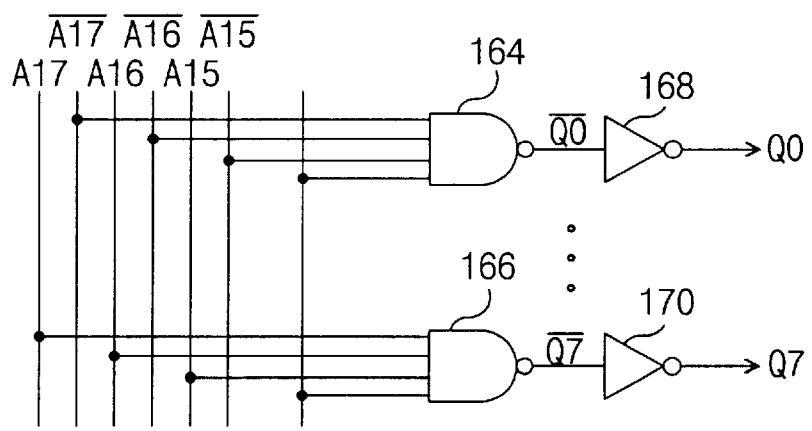
Figure 7:
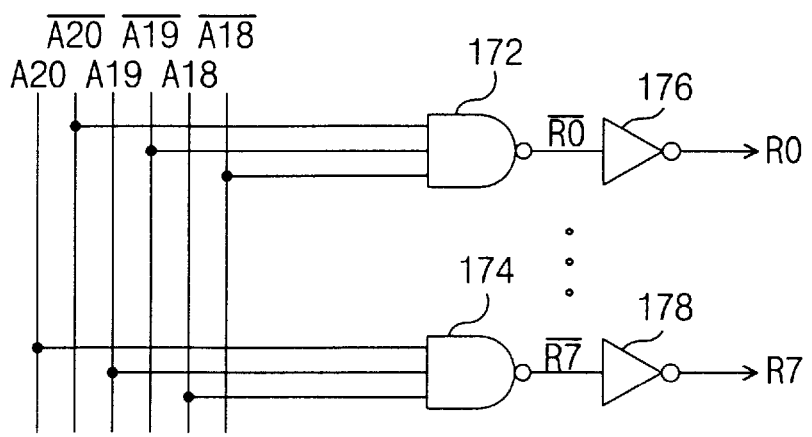

Referring now to FIG. 7, row predecoder 14 has three decoder groups corresponding to three sets of pre-decoding signals P0B to P7B, Q0B to Q7B and R0B to R7B. To generate P0B to P7B, NAND gates 156 to 158 receive row address signals A12 to A14 (including their complementary signals A12B to A14B) and inverters 160 to 162 convert output signals of the NAND gates to the first set of pre-decoding signals P0B to P7B. For Q0B to Q7B, NAND gates 164 to 166 receive A15 to A17 (including their complementary signals A15B to A17B) and further receive row decoder disable signal XDdisB generated from block selection controller 28. Thus, the second set of pre-decoding signals Q0B to Q7B are cut off when XDdisB transitions to logic low level. Thus, all of normal row blocks that are conditioned under the coded control with Q0B to Q7B would not be activated thereby. The Q0B to Q7B signals are coupled to outputs of NAND gates 164 to 166 through inverters 168 to 170. The third set of pre-decoding signals R0B to R7B is generated through NAND gates 172 to 174 and inverters 176 to 178. Each of NAND gates 172 to 174 receives row address signals A18 to A20 (including their complementary signals A18B to A20B). The pre-decoding signals are applied to the normal row decoders as shown in FIG. 2 or FIG. 3.

Figure 8:
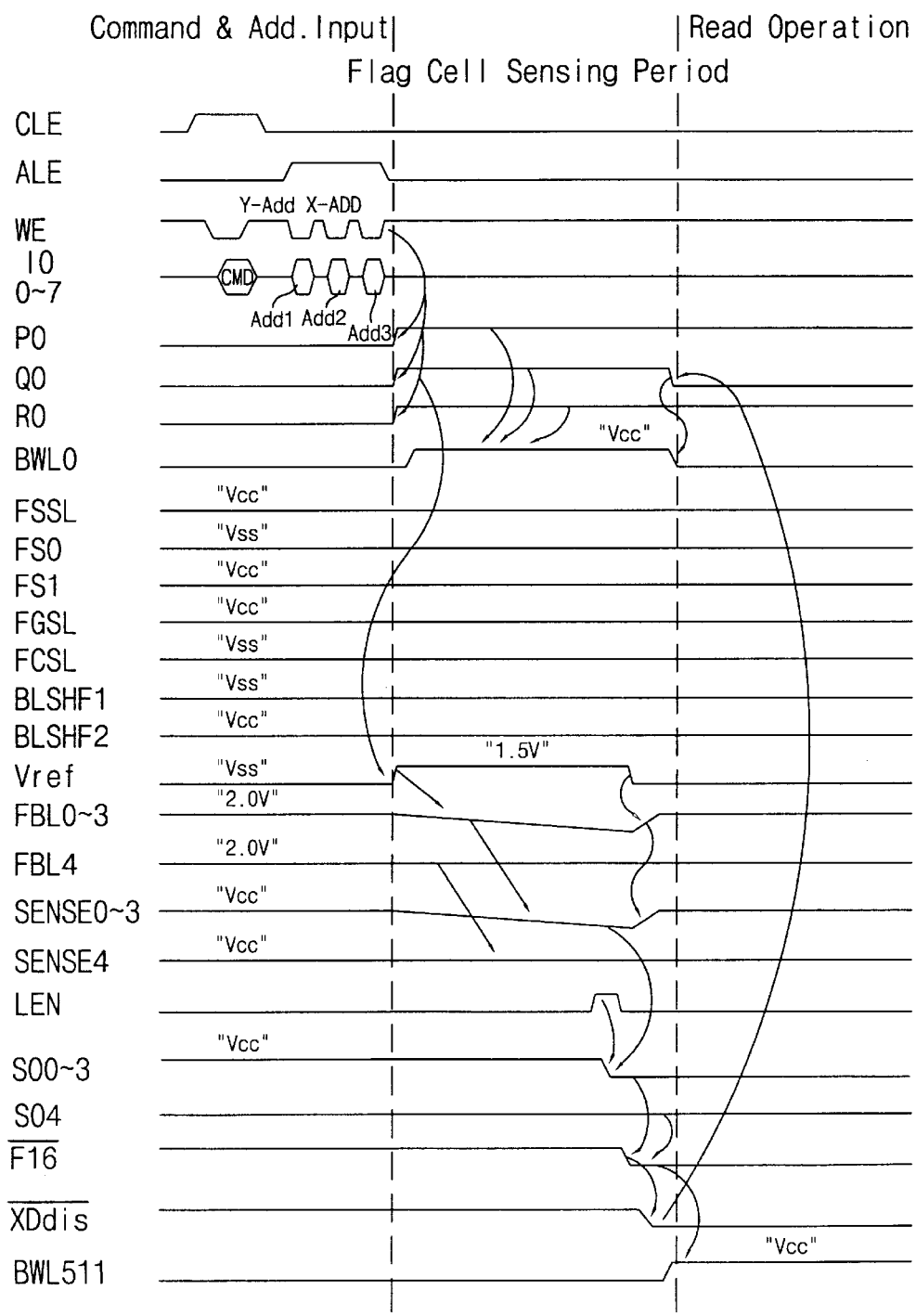
FIG. 8 is a timing diagram illustrating operation of memory devices according to the present invention.

The substitution and mapping mechanism will now be described referring to FIG. 8, which illustrates a timing flow during a read operation of a memory according to the invention. As shown in FIG. 8, the sequential operations include a command/address input period followed by a flag sensing period and followed by a reading period. In the command/address input period, a command signal CMD is applied through an input/output pin IO0 to IO7 in response to activations of command latch enable signal CLE and write enable signal WE, determining an operating mode. This timing is assumed to have a command signal for a read operation. After receiving command signal CMD by the first low transition of WE, address signals A0 to A20 are partially supplied, by eight bits, through the input/output pins IO0 to IO7 in response to subsequent low transitions of WE.

Assuming that normal row block MCBK0 is regarded as the seventeenth defective block (all of the denoted numerals in FIG. 8 correspond to the selection of MCBK0), when the address for MCBK0 appears, a sensing operation will be performed for its corresponding flag cell block FCBK0 in the flag sensing period. During the command/address input period, since in flag sense amplifier 24, reference voltage Vref is Vss and flag bit line shielding signals BLSHF1 and BLSHF2 are Vss and Vcc respectively, sensing nodes SENSEi are pulled up to Vcc as a precharge level and flag bit lines FBL0 to FBL4 are held at a precharge voltage level about 2 V that is to be reduced by threshold voltage of depletion transistor 72.

After finishing the address receipt, a flag cell sensing operation begins. It should be noted that the seventeenth defective block MCBK0, being out of the redundant capacity of the sixteen redundant row blocks, corresponds to flag cell block FCBK0 as shown in FIG. 2 or FIG. 3 in which flag bit lines FBL0 to FBL4 have been already set into the programming codes of "10000" in order to be substituted with its corresponding repair block MCBK511 as shown in TABLE 3. First, Vref is pulled up to 1.5 V from Vss so as to cut off the current supply. In flag cell block FCBK0, since BWL, FSSL, FS0, FS1, FGSL and FSSL are Vcc, Vss, Vcc, Vcc and Vss, respectively, and FBL0 to FBL3 except FBL4 are all "0", the flag cell transistors connected to FBL4 are turned off while flag cell transistors connected to FBL0 to FBL3 are turned on. Because there are current flows through on-cells, sensing nodes SENSE0 to SENSE3 corresponding to the FBL0 to FBL3 are pulled down to Vss while sensing node SENSE4 for FBL4 retains the present voltage level of Vcc. If a capacitance value on each flag bit line is 3 pF and a current value flowing through the on-cells is 5 uA, the time t for a decreasing from the voltage level of 2 V of the flag bit line to about 1.8 V may be obtained as follows:

$$t = \frac{C \cdot \Delta V}{I} = \frac{3 \times 10^{-12} \times 0.2}{3 \times 5 \times 10^{-6}} = 40 \ (ns)$$

The above equation indicates that it is possible for the sense amplifier to detect the existence of on-cells in 40 ns so that a voltage decrease at least by 0.2 V on the flag bit line coupled to on-cells can provide enough voltage fluctuation for detection at the sensing node which capacitance is much lower than that of the flag bit line. Further shortening of the sensing time for on-cells may be obtained by releasing the number of flag cell strings coupled to one flag bit line in parallel. Such an enhancement of the sensing speed can reduce redundancy time during substitutions.

Returning to FIG. 8, after developing the sensing nodes SENSE0 to SENSE3 corresponding to flag bit lines FBL0 to FBL3 coupled to the on-flag cells, enable signal LEN goes to high level. Defective block status signals SO0 to SO3 are thus pulled down to low through tristate inverter 80 and latch 90 while SO4 is high. The combination code "10000" with SO4 to SO0 are applied to flag decoder 26 and activates the seventeenth repair block selection signal F16B while other repair block selection signals are all high. The selected repair block selection signal F16B, in FIG. 6, causes row decoder disable signal XDdisB to be activated. The activated XDdisB, as shown in FIG. 7, makes it possible to generate row pre-decoding signals Ql of low levels which deactivates MCBK0. Referring to FIG. 3, in row decoder MRD511 which is engaged in FCBK511 and MCBK511, the row pre-decoding signal Qi makes the output of NAND gate 38 become high and repair block selection signal F16B holds the output of NAND gate 40 at high level, thereby causing block word line BWL511 to be pulled up to Vcc so as to activate MCBK511 as a repair block for the defective block MCBK0. Thereafter, a normal read operation begins to read out data from the substituted block MCBK511. The normal reading operation for MCBK511 is well known to those having skill in the art.

Additionally when a further defective row block such as MCBK3 is found as described above as a eighteenth defective block, the repair block to be substituted for the MCBK3 will be MCBK510. In preparing the flag cell blocks for the automatic mapping configurations, the number of combination codes involved in the substitution capacity is not limited to that of the embodiment described above.

Accordingly, nonvolatile memory devices according to the invention can perform an automatic bad block mapping without an effort by an user so that pseudo-useable blocks are provided in the main memory cell array in a sequential order as if those blocks substantially containing one or more defective blocks are nondefective blocks. Furthermore, since nonvolatile cells are employed in the flag cell blocks as status identification units, and interconnection structures are provided to enhance sensing speed, current consumption may be reduced compared to the conventional fuse programming redundancy. Thus, high speed, high density memory devices may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:

a plurality of normal memory cell blocks;

a plurality of redundant memory cell blocks; and means for substituting nondefective normal memory cell blocks for defective normal memory cell blocks that remain after substitution of the plurality of redundant memory cell blocks for defective normal memory cell blocks, so as to generate continuous addresses for the nondefective normal memory cell blocks.

2. An integrated circuit memory device according to claim 1 wherein the substituting means sequentially substitutes nondefective normal memory cell blocks, beginning at a highest nondefective normal memory cell block address and sequentially proceeding to lower nondefective memory cell block addresses, for defective normal memory cell blocks that remain after substitution of the plurality of redundant memory cell blocks for defective normal memory cell blocks, so as to generate continuous addresses for the nondefective normal memory cell blocks.

3. An integrated circuit memory device according to claim 1 wherein the substituting means further comprises:

means for substituting the plurality of redundant memory cell blocks for defective normal memory cell blocks.

4. An integrated circuit memory device comprising:

a plurality of memory cell blocks including defective memory cell blocks; and means for mapping the plurality of memory cell blocks excluding the defective memory cell blocks into a continuous address sequence of variable length.

5. An integrated circuit memory device according to claim 4 wherein the mapping means sequentially maps memory cell blocks excluding the defective memory cell blocks to defective normal memory cell blocks, beginning at a highest memory cell block address and sequentially proceeding to lower memory cell block addresses, so as to generate continuous addresses for the memory cell blocks.

6. An integrated circuit memory device comprising:

a plurality of normal memory cell blocks;

a plurality of redundant memory cell blocks;

a plurality of flag blocks, a respective one of which corresponds to a respective one of the normal memory cell blocks, each flag block containing one of a first indication that the corresponding normal memory cell block is nondefective, a second indication that the corresponding normal memory cell block is substituted with a redundant memory cell block, and a third indication that the corresponding normal memory cell block is substituted with another normal memory cell block; and means, responsive to the plurality of flag blocks, for substituting a redundant memory cell block for a selected normal memory cell block in response to the second indication being in a flag block that is associated with the selected normal memory cell block and for substituting a nondefective normal memory cell block for a selected normal memory cell block in response to the third indication being in a flag block that is associated with the selected normal memory cell block.

7. An integrated circuit memory device according to claim 6:

wherein the second indication comprises a plurality of second indications and wherein the third indication comprises a plurality of third indications;

the substituting means comprising means, responsive to the plurality of flag blocks, for substituting a selected redundant memory cell block for a selected normal memory cell block in response to a selected one of the second indications being in a flag block that is associated with the selected normal memory cell block and for substituting a selected nondefective normal memory cell block for a selected normal memory cell block in response to a selected one of the third indications being in a flag block that is associated with the selected normal memory cell block.

8. An integrated circuit memory device according to claim 6 wherein each of the flag blocks comprises:

a plurality of flag cell strings, each comprising a plurality of flag cell transistors that are serially connected between a pair of flag cell string selection transistors, the flag cell strings storing the one of a first indication that the corresponding normal memory cell block is nondefective, a second indication that the corresponding normal memory cell block is substituted with a redundant memory cell block, and a third indication that the corresponding normal memory cell block is substituted with another normal memory cell block;

a plurality of flag word lines, a respective one of which is connected to a corresponding flag cell transistor in each of the flag cell strings; and a plurality of flag bit lines, a respective one of which is connected to at least one of the flag cell string selection transistors.

9. An integrated circuit memory device according to claim 8 wherein selected ones of the plurality of flag cell strings in a flag cell block are electrically connected in parallel, and store a same one of a first indication that the corresponding normal memory cell block is nondefective, a second indication that the corresponding normal memory cell block is substituted with a redundant memory cell block, and a third indication that the corresponding normal memory cell block is substituted with another normal memory cell block.

10. An integrated circuit memory device according to claim 6 wherein the substituting means comprises:

a sense amplifier that detects the indication that is stored in a selected flag block and generates a defective block status signal therefrom;

a flag decoder that is responsive to the defective block status signal to generate a repair block selection signal; and a block selection controller that is responsive to the block status signal to disable a row decoder so that the row decoder does not select a normal memory cell block.

11. A method of operating an integrated circuit memory device including a plurality of normal memory cell blocks and a plurality of redundant memory cell blocks, the operating method comprising the step of:

substituting nondefective normal memory cell blocks for defective normal memory cell blocks that remain after substitution of the plurality of redundant memory cell blocks for defective normal memory cell blocks, so as to generate continuous addresses for the nondefective normal memory cell blocks.

12. A method according to claim 11 wherein the substituting step comprises the step of sequentially substituting nondefective normal memory cell blocks, beginning at a highest nondefective normal memory cell block address and sequentially proceeding to lower nondefective memory cell block addresses, for defective normal memory cell blocks that remain after substitution of the plurality of redundant memory cell blocks for defective normal memory cell blocks, so as to generate continuous addresses for the nondefective normal memory cell blocks.

13. A method according to claim 12 wherein the substituting step is preceded by the step of:

substituting the plurality of redundant memory cell blocks for defective normal memory cell blocks.

14. A method of operating an integrated circuit memory device comprising a plurality of memory cell blocks including defective memory cell blocks, the operating method comprising the step of:

mapping the plurality of memory cell blocks excluding the defective memory cell blocks into a continuous address sequence of variable length.

15. A method according to claim 14 wherein the mapping step comprises the step of sequentially mapping memory cell blocks excluding the defective memory cell blocks to defective normal memory cell blocks, beginning at a highest memory cell block address and sequentially proceeding to lower memory cell block addresses, so as to generate continuous addresses for the memory cell blocks.

16. A method of operating an integrated circuit memory device including a plurality of normal memory cell blocks and a plurality of redundant memory cell blocks, the operating method comprising the steps of:

for each normal memory cell block, storing in the integrated circuit memory device one of a first indication that the corresponding normal memory cell block is nondefective, a second indication that the corresponding normal memory cell block is substituted with a redundant memory cell block, and a third indication that the corresponding normal memory cell block is substituted with another normal memory cell block;

substituting a redundant memory cell block for a selected normal memory cell block in response to the second indication being in a flag block that is associated with the selected normal memory cell block; and substituting a nondefective normal memory cell block for a selected normal memory cell block in response to the third indication being in a flag block that is associated with the selected normal memory cell block.

17. A method according to claim 16:

wherein the second indication comprises a plurality of second indications and wherein the third indication comprises a plurality of third indications.

* * * * *